United States Patent
Tauchi et al.

(10) Patent No.: US 8,212,457 B2
(45) Date of Patent: Jul. 3, 2012

(54) PIEZOELECTRIC CERAMIC COMPOSITION, PIEZOELECTRIC ELEMENT, AND RESONATOR

(75) Inventors: Goushi Tauchi, Tokyo (JP); Tomohisa Azuma, Tokyo (JP); Hideaki Sone, Tokyo (JP)

(73) Assignee: TDK Corporation, Chuo-ku, Tokyo (JP)

( * ) Notice: Subject to any disclaimer, the term of this patent is extended or adjusted under 35 U.S.C. 154(b) by 0 days.

(21) Appl. No.: 13/052,414

(22) Filed: Mar. 21, 2011

(65) Prior Publication Data
US 2011/0234046 A1 Sep. 29, 2011

(30) Foreign Application Priority Data
Mar. 23, 2010 (JP) ................................. 2010-066743

(51) Int. Cl.
*H01L 41/187* (2006.01)
(52) U.S. Cl. ............. 310/358; 252/62.9 PZ; 252/62.9 R
(58) Field of Classification Search .................. 310/358; 252/62.9 R, 62.9 PZ; 501/134; *H01L 41/187*
See application file for complete search history.

(56) References Cited

U.S. PATENT DOCUMENTS

| | | | | |
|---|---|---|---|---|
| 3,640,866 A | * | 2/1972 | Nishida et al. | 252/62.9 PZ |
| 2002/0043642 A1 | * | 4/2002 | Tanimoto et al. | 252/62.9 PZ |
| 2011/0074516 A1 | * | 3/2011 | Sone et al. | 252/62.9 PZ |

FOREIGN PATENT DOCUMENTS

JP 2000-1367 1/2000

\* cited by examiner

*Primary Examiner* — Thomas Dougherty
*Assistant Examiner* — Karen B Addison
(74) *Attorney, Agent, or Firm* — Drinker Biddle & Reath LLP (57) ABSTRACT

Provided is a piezoelectric ceramic composition which can increase $Q_{max}$ of a resonator and inhibit the resonator from changing its oscillation frequency $F_0$ under a low temperature environment. The piezoelectric ceramic composition has a structure represented by the following general formula (1):

$$(Pb_\alpha Ln_\beta Me_\gamma)(Ti_{1-(x+y+z)}Zr_x Mn_y Nb_z)O_3 \qquad (1)$$

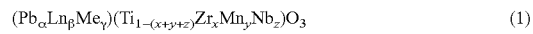

where Ln is a lanthanoid element, Me is an alkaline-earth metal element, $\alpha>0$, $\beta>0$, $\gamma\geq0$, $0.965\leq\alpha+\beta+\gamma\leq1.000$, $0.158\leq x\leq0.210$, $y\geq0$, $z\geq0$, and $1-(x+y+z)>0$.

3 Claims, 4 Drawing Sheets

PIEZOELECTRIC CERAMIC COMPOSITION, PIEZOELECTRIC ELEMENT, AND RESONATOR

BACKGROUND OF THE INVENTION

1. Field of the Invention

The present invention relates to a piezoelectric ceramic composition, a piezoelectric element, and a resonator.

2. Related Background Art

Piezoelectric ceramic compositions have both of a piezoelectric effect for causing electric polarization in response to a pressure from the outside and an inverse piezoelectric effect for generating distortion in response to an electric field applied thereto from the outside, and thus are employed as a material for performing interconversion between electric and mechanical energies. Such piezoelectric ceramic compositions have been in use in a wide variety of products such as resonators, filters, sensors, actuators, ignition devices, and ultrasonic motors (see Japanese Patent Application Laid-Open No 2000-1367).

Characteristics of such piezoelectric ceramic compositions have been improved by adding various accessory components to perovskite-type oxides based on PZT ($PbTiO_3$—$PbZrO_3$ solid solution) or PT ($PbTiO_3$). For example, Japanese Patent Application Laid-Open No. 2000-1367 proposes to improve the temperature characteristic of resonance frequency by adding $Nb_2O_5$ and $MnO_2$ to a perovskite-type oxide based on $PbTiO_3$.

SUMMARY OF THE INVENTION

Problem to be Solved by the Invention

When a resonator having a piezoelectric ceramic composition is used for an oscillation circuit, it is necessary for the resonator to have large in order to ensure an oscillation characteristic, Here, $Q_{max}$ is tan $\theta_{max}$, where $\theta_{max}$ is the maximum value (unit: deg) of the phase angle, i.e., the maximum value of Q (=|X|/R) between a resonance frequency $f_r$ and an anti-resonance frequency $f_a$, where X is the reactance, and R is the resistance. On the other hand, in order to adapt to products requiring a narrow tolerance for oscillation frequency $F_0$ (unit Hz), oscillation circuits have recently been demanded to have stable oscillation frequency $F_0$.

The inventors have found that a resonator using a conventional piezoelectric ceramic composition remarkably changes its oscillation frequency $F_0$ when stored at a low temperature (e.g., about −40° C.). Therefore, storing a resonator or an electronic device equipped with a resonator at a very low temperature for a long period is problematic in that the oscillation frequency $F_0$ of the resonator becomes it beyond the limit of its tolerance range.

For resonators using third harmonic waves of thickness extensional vibrations (the triple harmonic mode of thickness extensional vibrations), which use higher frequency bands than resonators utilizing a bending vibration mode and the like, the conventional piezoelectric ceramic compositions have not been fully satisfactory in terms of $Q_{max}$ and the stability of oscillation frequency $F_0$. The resonators using triple harmonic waves of thickness extensional vibrations are applicable to resonators which are devices issuing reference clocks for controlling microcomputers, for example. Therefore, piezoelectric ceramic compositions which exhibit sufficient performances when used in the resonators using triple harmonic waves of thickness extensional vibrations have been demanded from the viewpoint of replacing expensive crystal resonators, for example.

In view of the foregoing circumstances, it is an object of the present invention to provide a piezoelectric ceramic composition which can increase $Q_{max}$ of a resonator and inhibit the resonator from changing its oscillation frequency $F_0$ under a low temperature environment, a piezoelectric element using the piezoelectric ceramic composition, and a resonator using the piezoelectric element.

Means for Solving the Problems

For achieving the above-mentioned object, the piezoelectric ceramic composition of the present invention has a structure represented by the following general formula (1). The piezoelectric element of the present invention has a substrate constituted by the piezoelectric ceramic composition of the present invention. The resonator of the present invention comprises the piezoelectric element of the present invention and electrodes.

The present invention can attain a resonator which has large $Q_{max}$ and is hard to change its oscillation frequency $F_0$ under a low temperature environment.

Effect of the Invention

The present invention can provide a piezoelectric ceramic composition which can increase $Q_{max}$ of a resonator and inhibit it from changing the oscillation frequency $F_0$ under a low temperature environment, a piezoelectric element using the piezoelectric ceramic composition, and a resonator using the piezoelectric element.

DESCRIPTION OF THE PREFERRED EMBODIMENTS

In the following, preferred embodiments of the present invention will be explained in detail with reference to the drawings when appropriate. In the drawings, the same or equivalent constituents will be referred to with the same signs while omitting their overlapping explanations.

Figure 1:
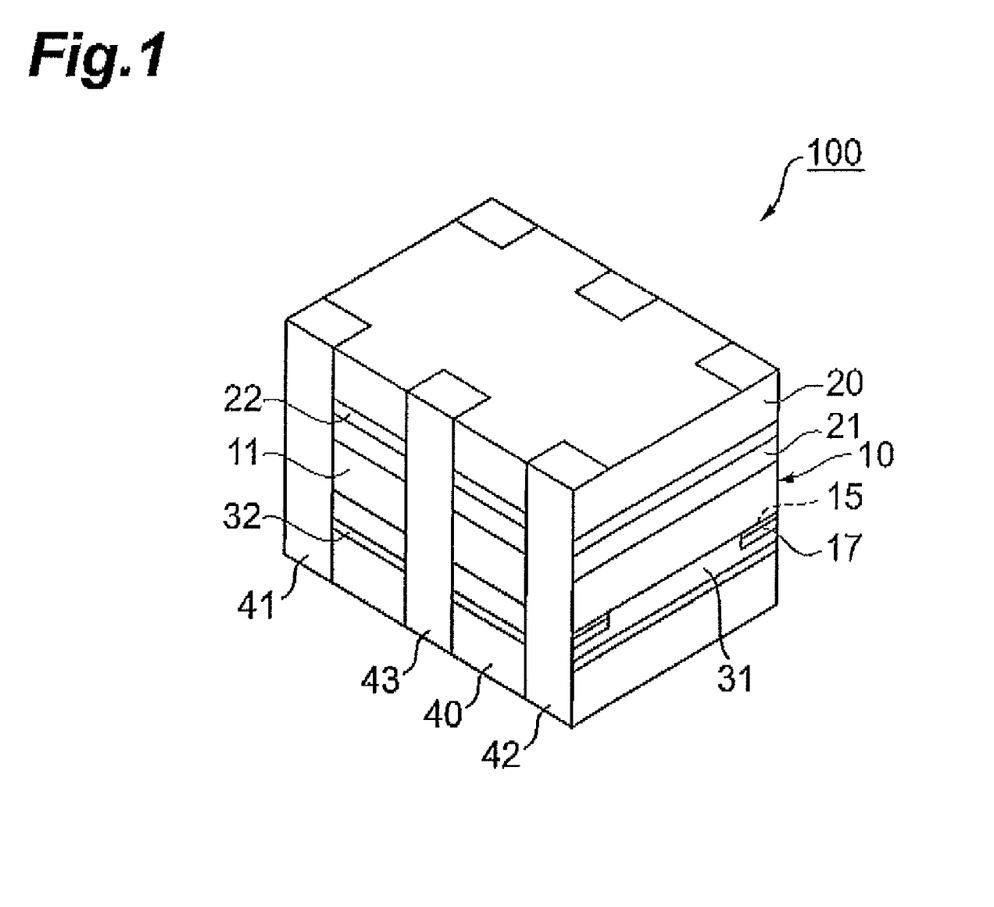
FIG. 1 is a perspective view illustrating a preferred embodiment of the resonator in accordance with the present invention.
Figure 2:
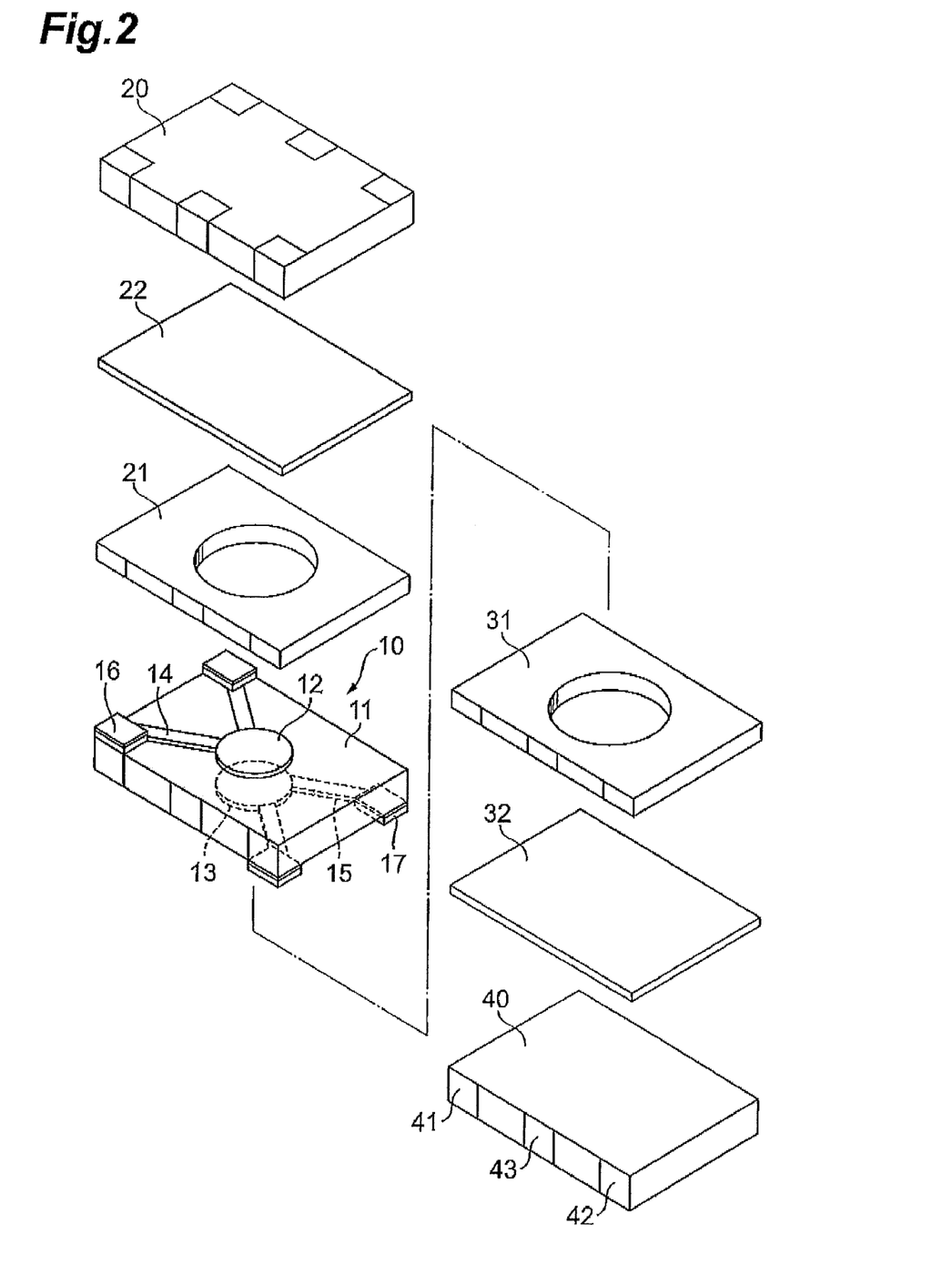
FIG. 2 is an exploded perspective view of the resonator illustrated in FIG. 1.

FIG. 1 is a perspective view illustrating a preferred embodiment of the resonator of the present invention. FIG. 2 is an exploded perspective view of the resonator illustrated in FIG. 1. The resonator 100 of FIG. 1 has a piezoelectric element 10, a top plate 20, a base substrate 40, terminal electrodes 41 to 43, a first hollow layer 21, a first sealing layer 22, a second hollow layer 31, and a second sealing layer 32.

The terminal electrodes 41 to 43 are formed like bands at predetermined intervals on both side faces of an assembly in which the base substrate 40, the second sealing layer 32, the second hollow layer 31, a piezoelectric substrate 11, the first hollow layer 21, the first sealing layer 22, and the top plate 20 are laminated in this order.

As illustrated in FIG. 2, the piezoelectric element 10 has the rectangular parallelepiped piezoelectric substrate 11 and the first and second vibrating electrodes 12, 13 disposed in respective center parts of opposing surfaces of the piezoelectric substrate 11. The area held between the first and second vibrating electrodes 12, 13 becomes a vibrating part.

The piezoelectric element 10 has two first lead electrodes 14 connected to the first vibrating electrode 12 on the surface provided with the first vibrating electrode 12. The two first lead electrodes 14 extend from the first vibrating electrode 12 to respective corners of the surface provided with the first vibrating electrode 12, so as to cover the opposing corner parts of the surface. End electrodes 16 are disposed on the first lead electrodes 14 at their portions covering the corner parts, so as to be electrically conducted to the first vibrating electrode 12 through the first lead electrodes 14. The first lead electrodes 14 and end electrodes 16 are disposed such as to be exposed partly at side faces of the assembly.

On the other hand, the piezoelectric element 10 has two lead electrodes 15 connected to the second vibrating electrode 13 on the surface provided with the second vibrating electrode 13. The two second lead electrodes 15 extend from the second vibrating electrode 14 to respective corners of the surface provided with the second vibrating electrode 13, so as to cover the opposing corner parts of the surface. End electrodes 17 are disposed on the second lead electrodes 14 at their portions covering the corner parts, so as to be electrically conducted to the second vibrating electrode 13 through the second lead electrodes 15. The second lead electrodes 15 and end electrodes 17 are disposed such as to be exposed partly at side faces of the assembly. The end electrodes 16 are disposed on one end side of the piezoelectric substrate 11, while the end electrodes 17 are disposed on the other end side of the piezoelectric substrate 11.

The first terminal electrodes 41 are formed on the side faces where the first lead electrodes 14 are exposed, so as to be connected to the first lead electrodes 14. The second terminal electrodes 42 are formed on the side faces where the second lead electrodes 15 are exposed, so as to be connected to the second lead electrodes 15. The third terminal electrodes 43 are used as grounding electrodes.

The first and second vibrating electrodes 12, 13 and first and second lead electrodes 14, 15 can be made by known methods, examples of which include thin-film techniques such as sputtering and thick-film techniques using pastes and the like.

The first hollow layer 21, first sealing layer 22, and top plate 20 are laminated in this order on one surface of the piezoelectric element 10. Specifically, one surface of the first hollow layer 21 is bonded to the piezoelectric element 10, one surface of the first sealing layer 22 is bonded to the other surface of the first hollow layer 21, and the top plate 20 is bonded to the other surface of the first sealing layer 22. Providing the top plate 20 can protect the first hollow layer 21 and first sealing layer 22, thereby improving the strength of the resonator 100.

The second hollow layer 31, second sealing layer 32, and base substrate 40 are laminated in this order on the other surface of the piezoelectric element 10. Specifically, one surface of the second hollow layer 31 is bonded to the piezoelectric element 10, one surface of the second sealing layer 32 is bonded to the other surface of the second hollow layer 31, and the base substrate 40 is bonded to the other surface of the second sealing layer 32. Providing the base substrate 40 can further enhance the mechanical strength of the resonator 100.

The resonator 100 is used as being mounted on a printed board, for example. The piezoelectric substrate 11 in the resonator 100 is constituted by the piezoelectric ceramic composition in accordance with an embodiment of the present invention. The piezoelectric ceramic composition of this embodiment has a perovskite-type crystal structure and is represented by the following general formula:

$$(Pb_\alpha Ln_\beta Me_\gamma)(Ti_{1-(x+y+z)}Zr_x Mn_y Nb_z)O_3 \quad (1)$$

where Ln is a lanthanoid element, Me is an alkaline-earth metal element, $\alpha > 0$, $\beta > 0$, $\gamma \geq 0$, $0.965 \leq \alpha+\beta+\gamma \leq 1.000$, $0.158 \leq x \leq 0.210$, $y \geq 0$, $z \geq 0$, and $1-(x+y+z) > 0$.

In the general formula (1), Ln is a lanthanoid element and denotes at least one kind of element selected from the group consisting of La, Ce, Pr, Nd, Pm, Sm, Eu, Gd, Tb, Dy, Ho, Er, Tm, Yb, and Lu. Among these lanthanoid elements, Ln preferably contains at least one kind of element selected from La, Pr, Ho, Gd, Sm, and Er in particular, more preferably La. In the general formula (1), Me is an alkaline-earth metal element and denotes at least one element selected from the group consisting of Sr, Ba, and Ca. Among these elements, Sr is preferred as Me.

When $\alpha+\beta+\gamma$ is less than 0.965, the resonator 100 changes its oscillation frequency $F_0$ greatly under a low temperature environment. Specifically, when $\alpha+\beta+\gamma$ is less than 0.965, the oscillation frequency $F_0$ of the resonator 100 after storage under the low temperature environment becomes smaller than therebefore. When $\alpha+\beta+\gamma$ is greater than 1.000, the resonator 100 decreases its $Q_{max}$. From similar viewpoints, $\alpha$, $\beta$, and $\gamma$ preferably satisfy $0.965 \leq \alpha+\beta+\gamma \leq 0.995$, more preferably $0.975 \leq \alpha+\beta+\gamma \leq 0.995$.

In general, a perovskite-type piezoelectric ceramic composition is represented by $A_\delta BO_3$. Here, $\delta$ is the ratio [A]/[B] of the number of all the atoms occupying the A site to the number of all the atoms occupying the B site and equals the value of $\alpha+\beta+$. The inventors consider that, when $\alpha+\beta+\gamma$ is outside of the numeric range mentioned above, $\delta$, i.e., [A]/[B], deviates greatly from the stoichiometric ratio of 1, so that defects are more likely to increase in the piezoelectric ceramic composition, thereby making it easier for the oscillation frequency $F_0$ to fluctuate greatly. However, the relationship between $\alpha+\beta+\gamma$ and the oscillation frequency $F_0$ is not completely clear and not limited thereto.

In the above-mentioned general formula (1), each of $\alpha$, $\beta$, and $\gamma$ is preferably a positive value of less than 1.000. Preferably, $\alpha$ satisfies $0.85 \leq \alpha < 1.000$. When $\alpha$ is less than 0.85, the piezoelectric ceramic composition tends to be more likely to lower its resistivity, thereby becoming harder to polarize at the time of manufacturing a piezoelectric element. When $\alpha$ is 1.000 or greater, $Q_{max}$ tends to become smaller. These tendencies can be suppressed when $\alpha$ falls within the range mentioned above. More preferably, from similar viewpoints, $\alpha$ satisfies $0.85 \leq \alpha \leq 0.95$ in the above-mentioned general formula (1). However, the effects of the present invention can be achieved even when $\alpha$ is outside of the numeric ranges mentioned above.

Preferably, $\beta$ satisfies $0 < \beta \leq 0.08$ in the above-mentioned general formula (1). When $\beta$ is 0, the piezoelectric ceramic composition tends to lower its sinterability. When $\beta$ exceeds 0.08, Curie temperature tends to drop, so that the piezoelectric element is more likely to depolarize when heated. These tendencies can be suppressed when $\beta$ falls within the range mentioned above. More preferably, from similar viewpoints, $\beta$ satisfies $0.02 \leq \beta \leq 0.06$. However, the effects of the present invention can be achieved even when β is outside of the numeric ranges mentioned above.

Preferably, γ satisfies $0<\gamma\leq0.05$ in the above-mentioned general formula (1). When γ is 0, sufficiently high frequency constant tends to be lost. When γ exceeds 0.05, Curie temperature tends to drop, so that the piezoelectric element is more likely to depolarize when heated. These tendencies can be suppressed when γ falls within the range mentioned above. From similar viewpoints, γ more preferably satisfies $0.002\leq\gamma\leq0.045$, further preferably $0.003\leq\gamma\leq0.02$. However, the effects of the present invention can be achieved even when γ is outside of the numeric ranges mentioned above.

In the above-mentioned general formula (1), x satisfies $0.158\leq x\leq0.210$. When x is less than 0.158, a densely sintered piezoelectric ceramic composition is hard to obtain. The temperature characteristic of the oscillation frequency $F_0$ also tends to worsen when x is less than 0.158.

When x exceeds 0.210, defects occur in impedance waveforms, thereby making it hard to measure triple harmonic waves of thickness extensional vibrations (the triple harmonic mode of thickness extensional vibrations) of the resonator 100. In resonators equipped with a piezoelectric substrate made of PT, i.e., $PbTiO_3$, an energy trapping phenomenon for triple harmonic waves of thickness extensional vibrations occurs. In resonators equipped with a piezoelectric substrate made of PZT, i.e., $Pb(Zr, Ti)O_3$, an energy trapping phenomenon occurs not for the triple harmonic waves but for fundamental waves of thickness extensional vibrations. In view of this fact, the inventors consider that the vibration characteristic of the piezoelectric ceramic composition approaches that of PZT when x exceeds 0.210, thereby causing the above-mentioned defects in impedance waveforms. However, the cause of defects in impedance waveforms according with the increase of x is not limited to the above. When x exceeds 0.210, Curie temperature also tends to drop, thereby making the piezoelectric element 10 easier to depolarize upon heating.

When x is at least 0.158 but not more than 0.210, the above-mentioned tendencies can be suppressed, while $Q_{max}$ can be enhanced. From similar viewpoints, x preferably satisfies $0.158\leq x\leq0.205$, more preferably $0.158\leq x\leq0.200$. When x exceeds 0.125, the ratio of $ZrO_2$ with respect to the mass of the part derived from oxides of Pb, Ln, and Ti exceeds 5 mass % in the piezoelectric ceramic composition represented by the above-mentioned general formula (1).

Preferably, y satisfies $0.020\leq y\leq0.050$ in the above-mentioned general formula (1). $Q_{max}$ tends to decrease when y is less than 0.020. When y exceeds 0.050, the piezoelectric ceramic composition is more likely to lower its resistivity, whereby polarization processing for providing the piezoelectric ceramic composition with a piezoelectric property tends to become harder at the time of manufacturing the piezoelectric element 10. These tendencies can be suppressed when y falls within the range mentioned above. More preferably, $0.030\leq y\leq0.045$ from similar viewpoints. However, the effects of the present invention can be achieved even when y is outside of the numeric ranges mentioned above.

Preferably, z satisfies $0.040\leq z\leq0.070$ in the above-mentioned general formula (1). The piezoelectric element tends to lower its sinterability when z is less than 0.040. When z exceeds 0.070, the resistivity tends to become so high that thermal shocks worsen characteristics greatly. These tendencies can be suppressed when z falls within the range mentioned above. More preferably, $0.050\leq z\leq0.070$ from similar viewpoints. However, the effects of the present invention can be achieved even when z is outside of the numeric ranges mentioned above.

The piezoelectric ceramic composition may contain elements other than those included in the above-mentioned general formula (1) as impurities or trace additives in the form of compounds or simple substances. Examples of such compounds include oxides of Na, Al, Si, P, K, Fe, Cu, Zn, Hf, Ta, and W. When the piezoelectric ceramic composition of this embodiment contains the above-mentioned oxides and the like, the total content of oxides in the piezoelectric ceramic composition is preferably 0.3 mass % or less of the whole piezoelectric ceramic composition based on oxides of the elements. That is, it will be preferred if, a main component of the piezoelectric ceramic composition, specifically 99.7 mass % or more of the whole, has the structure represented by the general formula (1). In this case, the piezoelectric ceramic composition substantially has the structure represented by the general formula (1).

In the resonator 100 of this embodiment, the piezoelectric element 10 has the piezoelectric substrate 11 made of the above-mentioned piezoelectric ceramic composition. Therefore, when the resonator 100 is used for an oscillation circuit as a resonator using the triple harmonic mode of thickness extensional vibrations, sufficiently high $Q_{max}$ and the oscillation frequency $F_0$ that is hard to change during storage under a low temperature environment are achieved. The resonator 100 of this embodiment is suitable as a resonator for hard disks with serial connection interfaces which require a narrow tolerance for the oscillation frequency $F_0$, for example.

An example of methods for manufacturing the resonator 100 in accordance with this embodiment will now be explained. This method comprises a mixing step of mixing material powders for the piezoelectric substrate 11; a sintering step of press-molding the material powders so as to form a preform and firing the preform so as to make a sintered product; a polarization step of polarizing the sintered product so as to form the piezoelectric substrate 11; a step of forming electrodes on the piezoelectric substrate 11 so as to yield the piezoelectric element 10; and a lamination step of laminating the piezoelectric element 10, hollow layers 21, 31, sealing layers 22, 32, top plate 20, and base substrate 40 so as to make the resonator 100. In the following, the individual steps will be explained in detail.

First, in the mixing step, start materials for producing the piezoelectric ceramic composition are prepared. Employable as the start materials are oxides of elements constituting the piezoelectric ceramic composition represented by the above-mentioned general formula (1) or compounds (carbonates, hydroxides, oxalates, nitrates, or the like) which will turn into the oxides after firing. As specific start materials, PbO, compounds of lanthanoid elements (e.g., $La_2O_3$ and $La(OH)_3$), compounds of alkaline-earth metal elements (e.g., $SrCO_3$, $BaCO_3$, and $CaCO_3$), $TiO_2$, $ZrO_2$, $MnO_2$ or $MnCO_3$, $Nb_2O_5$, and the like may be used. These start materials are compounded in such mass ratios as to form the piezoelectric ceramic composition having the structure represented by the above-mentioned general formula (1) after firing, and wet-mixed in a ball mill or the like.

Next, the mixed material obtained by wet mixing is temporarily shaped into a preform, and the latter is calcined. This calcining yields a calcined product. The calcining temperature is preferably 700 to 1050° C., while the calcining time is preferably about 1 to 3 hr. When the calcining temperature is too low, chemical reactions tend to proceed insufficiently in the preform. When the calcining temperature is too high, the preform tends to start sintering, thereby making it harder to pulverize thereafter. The calcining may be carried out either in the air or in an atmosphere having an oxygen partial pressure higher than that of the air or in a pure oxygen atmosphere.

Alternatively, the wet-mixed start materials may be calcined without being shaped into the preform.

Subsequently, the resulting calcined product is slurried and finely pulverized (wet-pulverized) in a ball mill or the like, and then the slurry is dried, so as to yield fine powders. Binders are added to thus obtained fine powders when necessary, so as to granulate the material powders. Examples of solvents preferably used for slurrying the calcined product include water, alcohols such as ethanol, and mixed solvents of water and ethanol. Examples of the binders added to the fine powders include organic binders used in general such as polyvinyl alcohol, polyvinyl alcohol having dispersants added thereto, and ethylcellulose.

The sintering step forms a molded product by press-molding the granulated material powders. The load at the time of molding the granulated material powders may be 100 to 400 MPa, for example.

The resulting molded product is then subjected to debindering. Preferably, the debindering is carried out for about 0.5 to 5 hr at a temperature of 300 to 700° C. The debindering may be performed either in the air or in an atmosphere having an oxygen partial pressure higher than that of the air or in a pure oxygen atmosphere.

After the debindering, the molded product is fired, so as to yield a sintered product containing the piezoelectric ceramic composition having the structure represented by the above-mentioned general formula (1). The firing temperature and firing time may be about 1150 to 1300° C. and about 1 to 8 hr, respectively. The debindering and firing of the molded product may be carried out continuously or separately.

The polarization step initially cuts the sintered product into thin plates and surface-processes them by lapping and polishing. The sintered product may be cut with cutting machines such as cutters, slicers, and dicing saws. After the surface processing, temporary electrodes for polarization are fanned on opposing surfaces of a thin plate-like sintered product. Cu is preferred as an electrically conductive material for constructing the temporary electrodes, since it can easily be removed by etching with a ferric chloride (II) solution, Vacuum vapor deposition or sputtering is preferably used for forming the temporary electrodes.

A polarization electric field is applied to the thin plate-like sintered product formed with the temporary electrodes for polarization, so as to perform polarization. The condition for polarization is determined appropriately according to the structure of the piezoelectric ceramic composition contained in the sintered product. For example, the temperature of the sintered product to be polarized is 50 to 250° C., the time for applying the polarization electric field is 1 to 30 min, and the magnitude of the polarization electric field is 0.9 times the coercive electric field of the sintered product or more.

After the polarization, the temporary electrodes formed on the sintered product are removed by etching or the like. Then, the sintered product is cut into a desirable device form, so as to yield the piezoelectric substrate 11. The piezoelectric substrate 11 is formed with the first and second vibrating electrodes 12, 13, which are vibrating electrodes, the first and second lead electrodes 14, 15, and the end electrodes 16, 17, whereby the piezoelectric element 10 of this embodiment can be obtained. Each electrode may be formed by vacuum vapor deposition, sputtering, plating, or, the like.

In the lamination step, the hollow layers 21, 31, sealing layers 22, 23, top plate 20, and base substrate 40 are prepared. They may be purchased as commercially available products or made by known methods. For example, layers mainly composed of epoxy resins may be used as the hollow layers and sealing layers, while those mainly composed of alumina, steatite, forsterite, aluminum nitride, or mullite may be used as the top plate 20 and base substrate 40. They are laminated in the order illustrated in FIG. 2 and bonded together with an adhesive if necessary, whereby the resonator 100 illustrated in FIG. 1 can be obtained.

The ratios of metal elements in the piezoelectric substrate 11 in the resonator 100 of this embodiment are equivalent to the compounding ratios of metal elements contained in the start materials. Therefore, adjusting the compounding ratios of the start materials can yield the piezoelectric substrate 11 constituted by the sintered product (piezoelectric ceramic composition) having a desirable structure.

Though preferred embodiments of the piezoelectric ceramic composition, piezoelectric element, and resonator in accordance with the present invention have been explained in detail in the foregoing, the present invention is not limited to the above-mentioned embodiments at all.

For example, the piezoelectric ceramic composition of the present invention may be used not only for resonators, but also for filters, actuators, ultrasonic washing machines, ultrasonic motors, vibrators for atomizers, fishfinders, shock sensors, ultrasonic diagnostic systems, waste toner sensors, gyro sensors, buzzers, transformers, lighters, and the like. The piezoelectric ceramic composition may constitute the sintered product or be contained in the calcined product obtained by the calcining or granulated material powders.

EXAMPLES

The present invention will now be explained in more detail with reference to examples and comparative examples. However, the present invention is not limited to the following examples at all.

A plurality of piezoelectric elements different from each other in terms of the structure of the piezoelectric ceramic composition were made by the following method.

In the making of the piezoelectric elements, respective powder materials of lead oxide (PbO), lanthanum oxide ($La_2O_3$), strontium carbonate ($SrCO_3$), titanium oxide ($TiO_2$), zirconium oxide ($ZrO_2$), manganese carbonate ($MneO_3$), and niobium oxide ($Nb_2O_5$) were prepared as materials for the piezoelectric ceramic compositions. The powder materials were weighed and compounded such that a ceramic sample (sintered product) after the final firing became a piezoelectric ceramic composition having a structure represented by the following formula (1a). Also, a plurality of kinds of mixed materials were prepared while changing the compounding ratios of powder materials such that $\alpha$, $\alpha+\beta+\gamma$, and x attained their values listed in the following Tables 1 and 2.

$$(Pb_\alpha La_\beta Sr_\gamma)(Ti_{1-(x+y+z)}Zr_x Mn_y Nb_z)O_3 \quad (1a)$$

where $\beta=0.035$, $\gamma=0.01$, $y=0.036$, and $z=0.064$.

Thus prepared mixed materials and pure water were mixed with Zr balls in a ball mill for 10 hr, so as to yield a slurry. After the slurry is sufficiently dried, the resultant was press-molded and then calcined at 900° C., so as to yield a calcined product. Subsequently, the calcined product was finely pulverized in the ball mill, dried, and then granulated with an appropriate amount of PVA (polyvinyl alcohol) added thereto. About 3 g of thus obtained granules were put into a mold of 20 mm (L)×20 mm (W) and molded with a uniaxial press under a pressure of 245 MPa.

The molded samples were heat-treated, so as to remove the binder, and then finally fired at a firing temperature of 1260° C. for 2 to 6 hr. In this manner, a plurality of sintered products having different compositions were obtained.

Each sintered product was flattened into a thickness of 0.4 mm with a double-sided lapping machine and then was cut into a size of 16 mm (L)×16 mm (W) with a dicing saw, so as to yield a ceramic sample. Both end parts of the ceramic sample were coated with an Ag paste, so as to form a pair of Ag temporary electrodes.

Thereafter, the ceramic sample formed with the Ag temporary electrodes was subjected to such polarization that an electric field which was 1.5 to 2 times the coercive electric field was applied thereto for 15 min in a silicone oil bath at a temperature of 120° C., so as to yield a piezoelectric substrate. After the polarization, the temporary electrodes were removed from the piezoelectric substrate, and the piezoelectric substrate was polished with the lapping machine again to a thickness of about 0.25 mm. Thereafter, the piezoelectric substrate was stored in a thermostatic bath at a temperature of 200 to 300° C. for 5 min to 1 hr in order to stabilize its characteristics. After the storage, the piezoelectric substrate was cut into a test strip of 7 mm×4.5 mm with a dicing saw, and the vibrating electrodes 12, 13, lead electrodes 14, 15, and end electrodes 16, 17 were formed on both faces of the piezoelectric substrate 11 as illustrated in FIG. 2 by a vacuum vapor deposition system, whereby each piezoelectric element 10 was obtained as in FIG. 2. Each of the vibrating electrodes 12, 13 was formed by laminating a Cr foundation layer having a thickness of 0.01 μm and an Ag layer having a thickness of 1.5 μm. The lead electrodes 14, 15 and end electrodes 16, 17 were formed by sputtering.

[Calculation of the Ratio of Change in $F_0$ Under a Low Temperature Environment]

The oscillation frequency $F_{01}$ of each piezoelectric element 10 was measured under an environment at 25° C. After measuring $F_{01}$, each piezoelectric element 10 was stored for 100 hr within a thermostatic bath at −40° C. After being stored for 100 hr, each piezoelectric element 10 was taken out of the thermostatic bath and then left as it stood for 24 hr under the environment at 25° C. After each piezoelectric element 10 was left as it stood for 24 hr, its oscillation frequency $F_{02}$ was measured under the environment at 25° C. $F_{01}$ and $F_{02}$ were measured with a frequency counter. Employed as the frequency counter was model 53181A manufactured by Agilent Technologies.

From the measured values of $F_{01}$ and $F_{02}$, the ratio of change $\Delta F_0$ (unit: ppm) in the oscillation frequency $F_0$ was calculated according to the following equation (A):

$$\Delta F_0 = [(F_{02} - F_{01})/F_{01}] \times 10^6 \quad (A)$$

Figure 3:
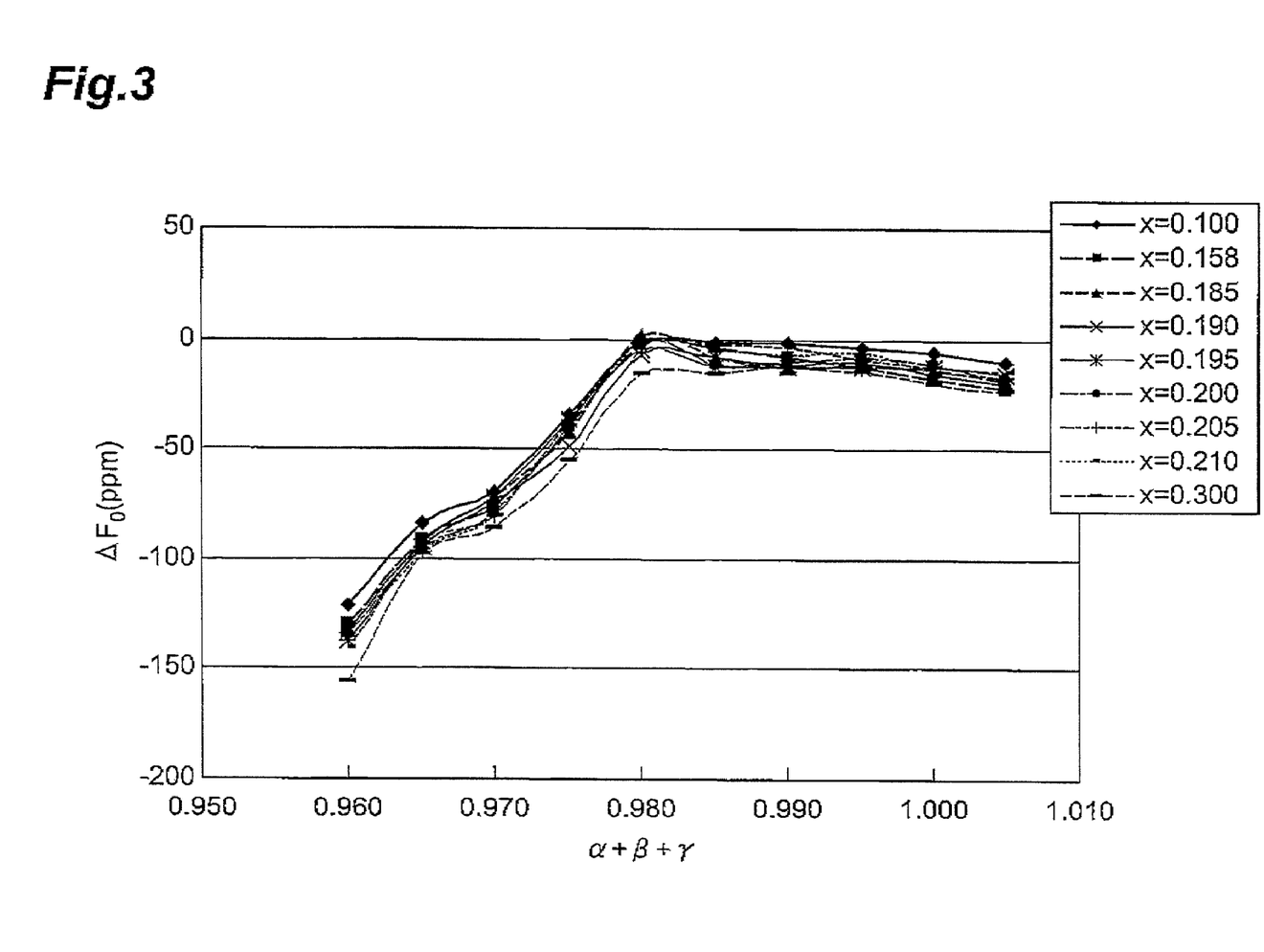
FIG. 3 is a graph illustrating how the values of $\alpha+\beta+\gamma$ and x in piezoelectric ceramic compositions relate to the ratio of change in the oscillation frequency $F_0$ of resonators.

Table 1 lists $\Delta F_0$ of the piezoelectric elements 10. In Table 1, the values listed in the part surrounded by a double line indicate $\Delta F_0$ of the piezoelectric elements 10. FIG. 3 illustrates how the values of $\alpha+\beta+\gamma$ and x in the piezoelectric ceramic composition of each piezoelectric element listed in Table 1 relate to $\Delta F_0$ of each piezoelectric element 10.

TABLE 1

| | | $\Delta F_0$(ppm) | | | | | | | | |
|---|---|---|---|---|---|---|---|---|---|---|
| α | α + β + γ | x = 0.100 | x = 0.158 | x = 0.185 | x = 0.190 | x = 0.195 | x = 0.200 | x = 0.205 | x = 0.210 | x = 0.300 |
| 0.915 | 0.960 | −121 | −130 | −132 | −137 | −133 | −134 | −138 | −141 | −156 |
| 0.920 | 0.965 | −84 | −91 | −93 | −95 | −93 | −96 | −97 | −94 | −98 |
| 0.925 | 0.970 | −70 | −76 | −72 | −74 | −72 | −79 | −80 | −81 | −86 |
| 0.930 | 0.975 | −34 | −40 | −42 | −49 | −37 | −39 | −99 | −37 | −55 |
| 0.936 | 0.980 | −1 | −3 | 2 | −7 | −5 | 0 | −2 | −1 | −16 |
| 0.940 | 0.985 | −2 | −4 | −8 | −8 | −12 | −11 | −5 | −3 | −16 |
| 0.945 | 0.990 | −2 | −8 | −12 | −11 | −13 | −10 | −7 | −4 | −13 |
| 0.950 | 0.995 | −4 | −13 | −11 | −10 | −12 | −8 | −6 | −9 | −15 |
| 0.955 | 1.000 | −6 | −18 | −14 | −16 | −13 | −11 | −15 | −12 | −20 |
| 0.960 | 1.005 | −10 | −22 | −19 | −20 | −16 | −18 | −17 | −15 | −23 |

[Measurement of $Q_{max}$]

Figure 4:
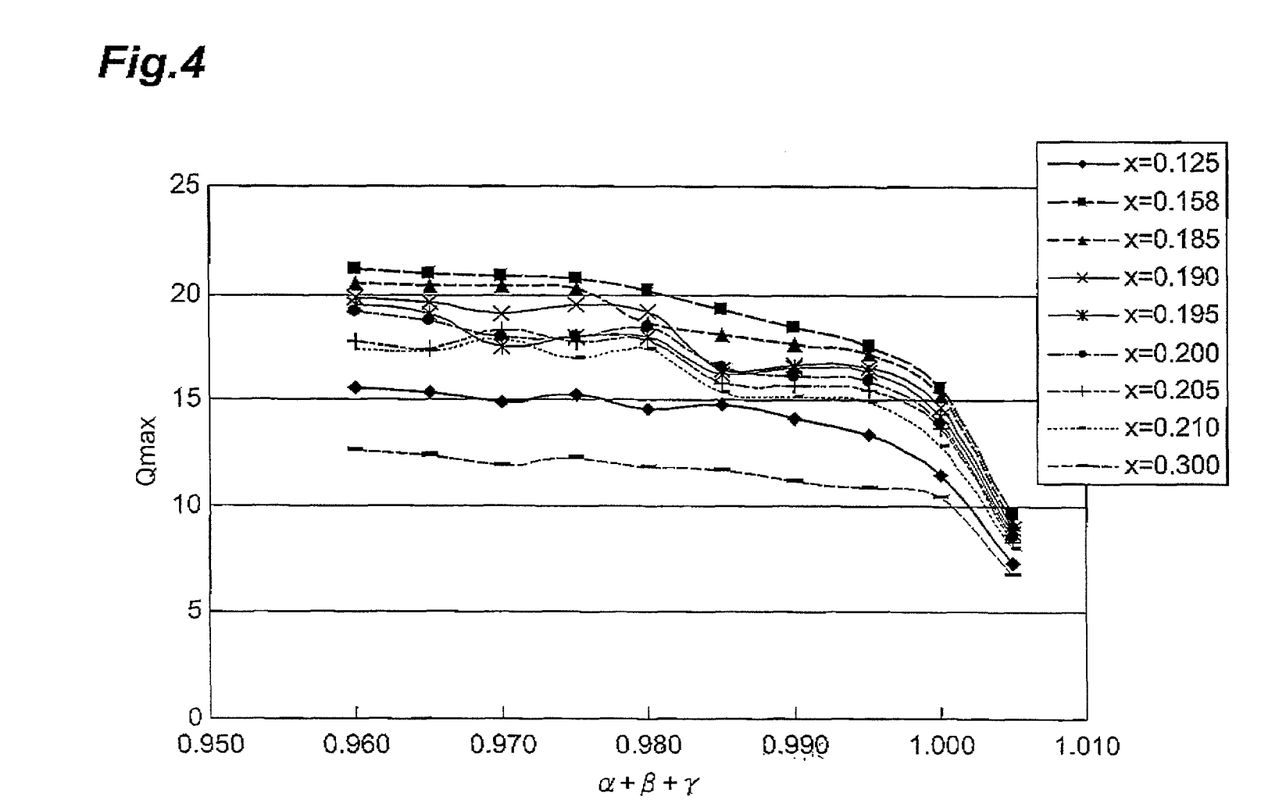
FIG. 4 is a graph illustrating how the values of $\alpha+\beta+\gamma$ and x in piezoelectric ceramic compositions relate to $Q_{max}$ of resonators.

Using an impedance analyzer, $Q_{max}$ of each piezoelectric element 10 in the triple harmonic mode of thickness extensional vibrations was measured at about 30 MHz. Employed as the impedance analyzer was model 4294A manufactured by Agilent Technologies. Table 2 lists $Q_{max}$ of the piezoelectric elements 10. In Table 2, the values listed in the part surrounded by a double line indicate $Q_{max}$ of the piezoelectric elements 10. FIG. 4 illustrates how the values of $\alpha+\beta+\gamma$ and x in the piezoelectric ceramic composition of each piezoelectric element listed in Table 2 relate to $Q_{max}$ of each piezoelectric element 10.

TABLE 2

| | | Qmax | | | | | | | | |
|---|---|---|---|---|---|---|---|---|---|---|
| α | α + β + γ | x = 0.125 | x = 0.158 | x = 0.185 | x = 0.190 | x = 0.195 | x = 0.200 | x = 0.205 | x = 0.210 | x = 0.300 |
| 0.915 | 0.960 | 15.6 | 21.2 | 20.5 | 19.8 | 19.5 | 19.2 | 17.6 | 17.4 | 12.6 |
| 0.920 | 0.965 | 15.3 | 20.9 | 20.4 | 19.6 | 19.1 | 18.7 | 17.4 | 17.3 | 12.4 |
| 0.925 | 0.970 | 14.9 | 20.8 | 20.4 | 19.1 | 17.6 | 18.0 | 18.3 | 17.9 | 12 |
| 0.930 | 0.975 | 15.2 | 20.7 | 20.3 | 19.5 | 18.0 | 18.0 | 17.6 | 17.0 | 12.3 |
| 0.935 | 0.980 | 14.6 | 20.2 | 16.6 | 19.2 | 18.0 | 18.4 | 17.9 | 17.4 | 11.8 |
| 0.940 | 0.985 | 14.8 | 19.3 | 18.1 | 16.5 | 16.2 | 16.6 | 15.8 | 15.4 | 11.7 |
| 0.945 | 0.990 | 14.1 | 18.4 | 17.8 | 16.7 | 16.6 | 16.1 | 15.7 | 15.1 | 11.2 |
| 0.950 | 0.995 | 13.4 | 17.5 | 17.2 | 16.6 | 16.3 | 15.9 | 15.5 | 14.9 | 10.8 |
| 0.955 | 1.000 | 11.5 | 15.6 | 15.2 | 14.7 | 14.3 | 13.9 | 13.7 | 12.8 | 10.4 |
| 0.980 | 1.005 | 7.4 | 9.6 | 9.2 | 9.0 | 8.8 | 8.5 | 8.3 | 8.0 | 6.6 |

As Tables 1 and 2 and FIGS. 3 and 4 illustrate, the piezoelectric elements having piezoelectric ceramic compositions with $\alpha+\beta+\gamma$ of at least 0.965 but not more than 1.000 and x of at least 0.158 but not more than 0.210 were seen to exhibit large $Q_{max}$ and small absolute values of $\Delta F_0$.

REFERENCE SIGNS LIST

10 ... piezoelectric element; 11 ... piezoelectric substrate; 12 ... first vibrating electrode (vibrating electrode); 13 ... second vibrating electrode (vibrating electrode); 14 ... first lead electrode (lead electrode); 15 ... second lead electrode (lead electrode); 16, 17 ... end electrode; 20 ... top plate; 21 ... first hollow layer (hollow layer); 22 ... first sealing layer (sealing layer); 31 ... second hollow layer (hollow layer); 32 ... second sealing layer (sealing layer); 40 ... base substrate; 41, 42, 43 ... terminal electrode; 100 ... resonator

What is claimed is:

1. A piezoelectric ceramic composition having a structure represented by the following general formula (1):

$$(Pb_\alpha Ln_\beta Me_\gamma)(Ti_{1-(x+y+z)}Zr_x Mn_y Nb_z)O_3 \quad (1)$$

where Ln is a lanthanoid element, Me is an alkaline-earth metal element, $\alpha>0$, $\beta>0$, $\gamma\geqq0$, $0.965\leqq\alpha+\beta+\gamma\leqq1.000$, $0.158\leqq x\leqq0.210$, $y\geqq0$, $z\geqq0$, and $1-(x+y+z)>0$.

2. A piezoelectric element having a substrate constituted by the piezoelectric ceramic composition according to claim 1.

3. A resonator comprising the piezoelectric element according to claim 2 and electrodes.

* * * * *